United States Patent [19]

Nuyen

[11] Patent Number: 5,458,694
[45] Date of Patent: Oct. 17, 1995

[54] MULTISPECTRAL PHOTOVOLTAIC COMPONENT COMPRISING A STACK OF CELLS, AND METHOD OF MANUFACTURE

[75] Inventor: Linh T. Nuyen, Paris, France

[73] Assignee: Picogiga Societe Anonyme, Les Ulis, France

[21] Appl. No.: 162,174

[22] PCT Filed: Apr. 15, 1993

[86] PCT No.: PCT/FR93/00375

§ 371 Date: Feb. 14, 1994

§ 102(e) Date: Feb. 14, 1994

[87] PCT Pub. No.: WO93/21662

PCT Pub. Date: Oct. 28, 1993

[30] Foreign Application Priority Data

Apr. 15, 1992 [FR] France .................... 92 04633

[51] Int. Cl.[6] .............................. H01L 31/06; H01L 31/18
[52] U.S. Cl. .................................. 136/249; 437/2; 437/5
[58] Field of Search ................ 437/2–5; 136/249 TJ, 136/262; 204/129.3, 129.1

[56] References Cited

U.S. PATENT DOCUMENTS

| | | | |
|---|---|---|---|
| 4,094,704 | 6/1978 | Milnes | 136/244 |
| 4,289,920 | 9/1981 | Hovel | 136/246 |
| 4,338,480 | 7/1982 | Antypas et al. | 136/249 TJ |
| 4,377,723 | 3/1983 | Dalal | 136/249 TJ |
| 4,680,422 | 7/1987 | Stanbery | 136/249 |
| 4,686,323 | 8/1987 | Biter et al. | 136/249 |
| 4,692,557 | 9/1987 | Ellion et al. | 136/262 |
| 4,774,194 | 9/1988 | Hokuyou | 437/5 |
| 4,846,931 | 7/1989 | Gmitter et al. | 156/633 |
| 4,914,044 | 4/1990 | Grabmaier et al. | 437/4 |
| 4,935,383 | 6/1990 | Nouhi et al. | 437/81 |
| 5,202,018 | 4/1993 | Horányl | 204/129.2 |

FOREIGN PATENT DOCUMENTS 3727823  3/1989  Germany.

OTHER PUBLICATIONS

N. P. Kim et al., "High Specific Power (AlGaAs)GaAs/CuInSe2 Tandem Junction Solar Cells for Space Applications", 24th I.E.C.E.C, Aug. 6, 1989, pp. 779–784, Wash., D.C.

B. J. Stanbery et al., "Thin Film Tandem GaAs/CuInSe2 Solar Cells for Space Power Applications", 19th IEEE Photovoltaic Specialists Conf., May 4, 1987, New Orleans, La., pp. 280–284.

M. Konagai et al., "High Efficiency GaAs Thin Film Solar Cells By Peeled Film Technology", J. Crystal Growth, vol. 45, 1978, pp. 277–280 Amsterdam, NL.

J. M. Gee et al, *Conference Record, 18th IEEE Photo Voltaic Spenalists Conf.* (1985), pp. 546–551.

J. M. Gee, *Proceedings, 6th E. C., Photoro Haie Solar Energy Conf.* (1985), pp. 245–253.

Primary Examiner—Aaron Weisstuch
Attorney, Agent, or Firm—Jacobson, Price, Holman & Stern

[57] ABSTRACT

The method comprises the following steps:
  (a) producing a first cell (1) comprising a first substrate (4), a first optically active layer (5), and between said substrate and said active layer, a soluble thin layer (12);
  (b) producing a second cell (2) comprising a second substrate (8) and a second optically active layer (9), different in nature from the first;
  (c) placing said two cells face to face so that the active layers face each other;
  (d) uniting the two elementary cells via their active layers by means of a transparent adhesive (3); and
  (e) dissolving the material of the soluble layer while leaving the other materials intact, thereby separating the first substrate from the remainder of the structure, without dissolving the first substrate.

12 Claims, 2 Drawing Sheets

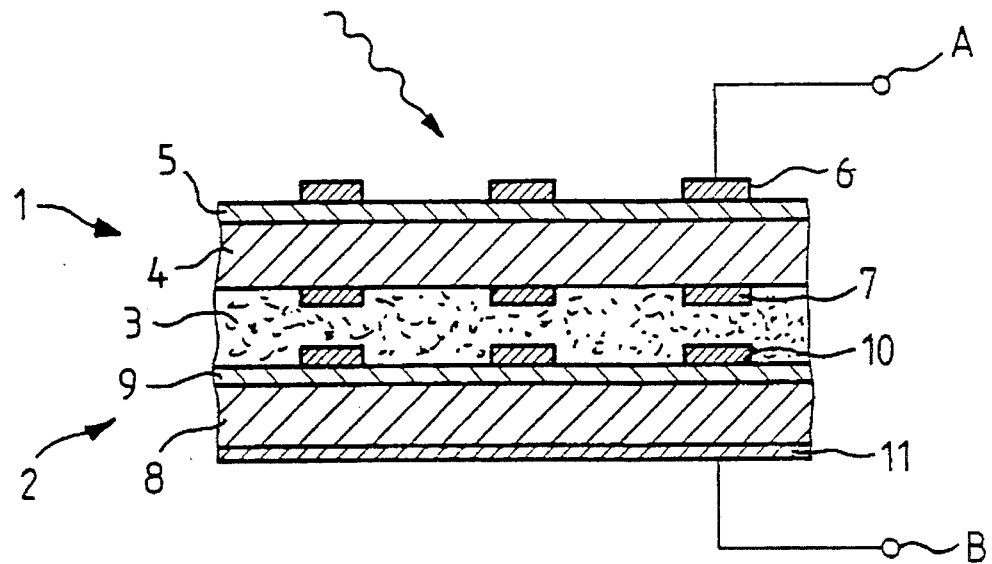
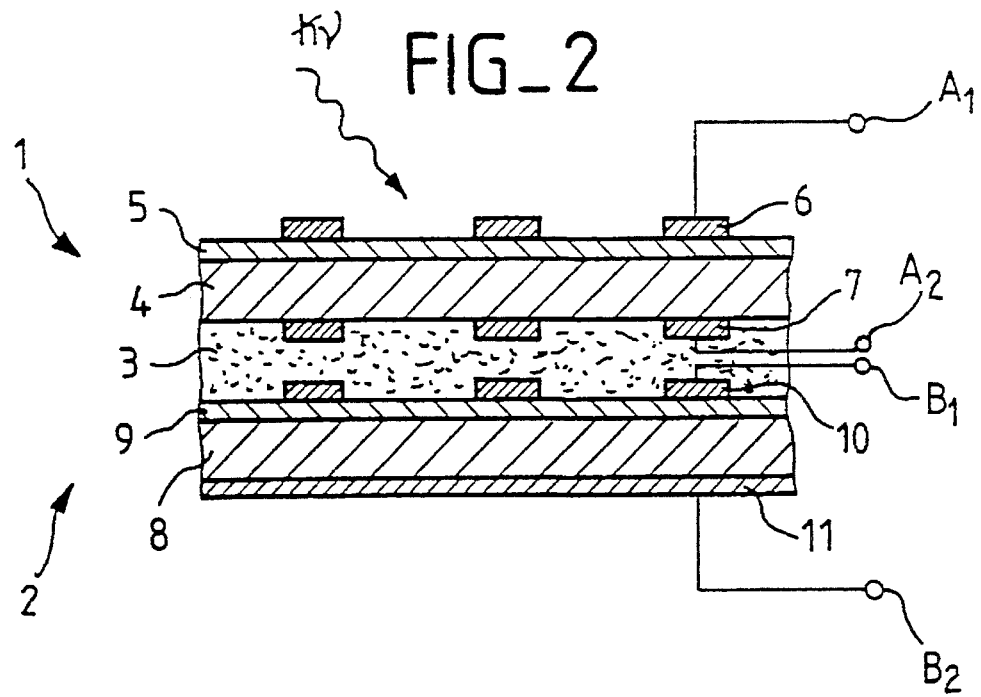

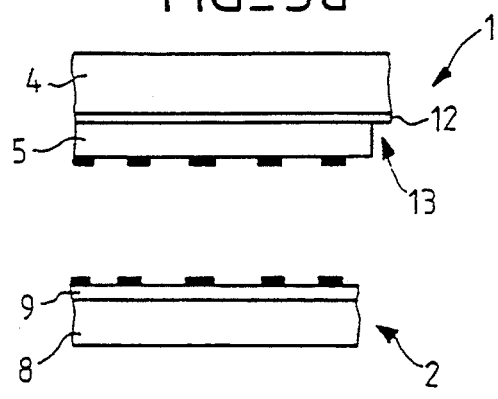
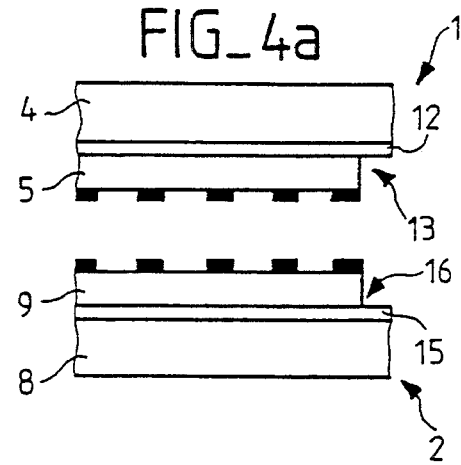
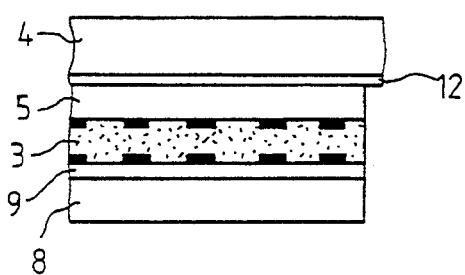
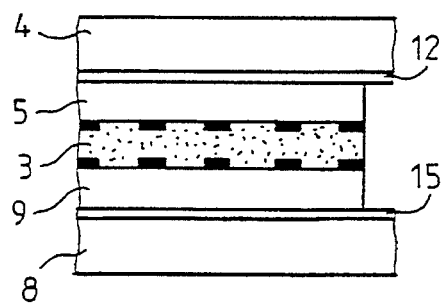
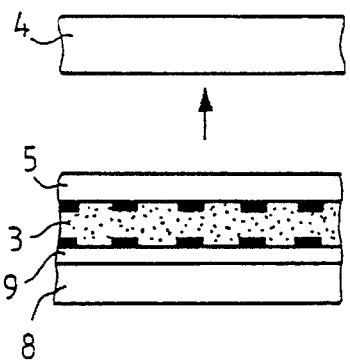
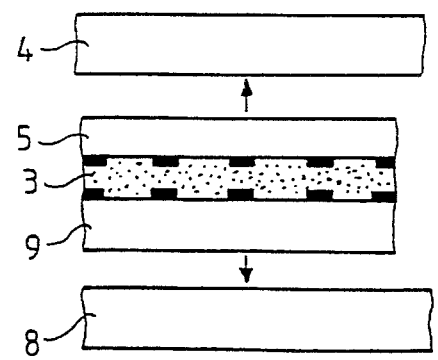
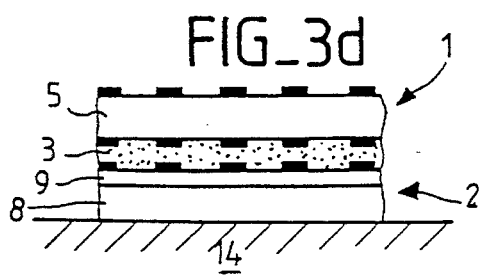
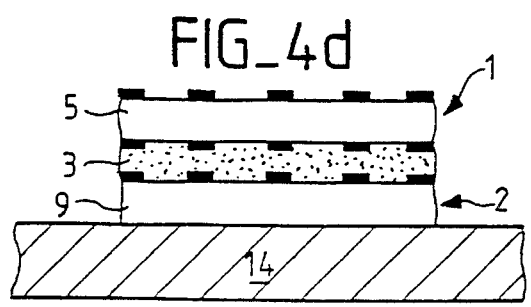

MULTISPECTRAL PHOTOVOLTAIC COMPONENT COMPRISING A STACK OF CELLS, AND METHOD OF MANUFACTURE

FIELD OF THE INVENTION

The invention relates in General terms to converting light energy, in particular solar energy, into electrical energy by means of components that implement the photovoltaic effect produced in semiconductors.

BACKGROUND OF THE INVENTION

When such components, generally called "solar cells", make use of one species only of semiconductor material (usually silicon or Gallium arsenide) they cannot achieve best transformation of the light energy in solar radiation because of the spread of the solar spectrum. A given semiconductor material has a forbidden band of determined width, such that photons having smaller energy than said bandwidth are not absorbed and therefore cannot generate the electron-hole pairs required for producing photocurrent. Conversely, photons having energy greater than that of the forbidden band will indeed create electron-hole pairs, but with excess energy relative to the energy of the forbidden band, which excess is converted into heat and not into electrical energy.

To improve solar energy conversion, proposals have been made to associate in various configurations a plurality of different semiconductors having forbidden bands of different widths. Such components are called "multispectral solar cells".

The present invention relates to one of the proposed configurations, known as a "stacked" configuration which involves preparing two (or more) different cells each on its own substrate and then in superimposing the cells by fixing them together with a transparent adhesive. The adhesive may be conductive, thereby enabling two cells to be connected in series (but in that case the photocurrent produced by the device is limited to the lowest photocurrent that is generated), or else the adhesive may be insulating, with each of the cells then being provided with its own electrodes that are separately connected to distinct circuits of the electronics in the charging system (which must therefore be designed accordingly).

That configuration suffers from a certain number of drawbacks, in particular the fact that since the two cells have to be made separately, the final component has two thicknesses of substrate, thereby increasing both the weight and the cost of the structure correspondingly, particularly when stacking a GaAs cell (or a fortiori an InP cell) on a silicon cell: the heavier and more expensive GaAs substrate is not used for mechanical support and it plays no active role. It is indeed possible to thin this layer down by lapping, thereby reducing the weight of the cell, but that further increases cost, since the material removed by lapping is not recoverable and the additional lapping step contributes to increasing the final production cost of the component.

OBJECTS OF THE INVENTION

One of the objects of the invention is to remedy the drawbacks of multispectral cells of that type, reducing the cost and the weight thereof by eliminating one or both substrates, with all of the related advantages that may step therefrom. Thus, since the substrate is eliminated, it is no longer necessary to form vias through the substrate for making contact with the lower layer of the component; the cost of manufacturing the component is thus reduced; the weight of the component is considerably reduced, which is advantageous in space applications; finally, heat dissipation is clearly improved by elimination of the thermal resistance that is constituted in present components by the substrate (GaAs and InP being poor conductors of heat).

SUMMARY OF THE INVENTION

To this end, the present invention proposes making the components by a method involving: (a) producing first cell comprising a first substrate, a first optically active layer, and between said substrate and said active layer, a soluble thin layer; (b) producing a second cell comprising a second substrate and a second optically active layer, different in nature from the first; (c) placing said two cells face to face so that the active layers face each other; (d) uniting the two elementary cells via their active layers by means of a transparent adhesive; and (e) dissolving the material of the soluble layer while leaving the other materials intact, thereby separating the first substrate from the remainder of the structure, without dissolving the first substrate.

Advantageously, in step (b) the second cell is produced with a soluble thin layer between its substrate and its active layer, so that in step (e) the second substrate is likewise separated from the remainder of the structure.

The material of the first substrate and/or of the second substrate is a binary or a ternary III–V semiconductor, the corresponding soluble thin layer is an epitaxially grown layer of ternary III–V semiconductor material having a molar fraction of aluminum of not less than 40% and an atomic lattice that is compatible with that of the substrate on which it is grown epitaxially, and the dissolution in step (e) is performed chemically.

This material may be a semi-insulating or n type semiconductor, in which case the corresponding soluble thin layer may be a layer of $p^+$ doped semiconductor material, the corresponding active layer including at least an n doped lower layer and the dissolving of step (e) being performed anodically and without illumination.

In either case, it is possible to fix the structure obtained at step (e) on a reflective support.

The invention also provides, as a novel product, a multispectral photovoltaic component comprising a stack of at least two elementary cells in association, having different spectral response characteristics and including a first cell comprising a first optically active layer, a second cell comprising a second optically active layer of a different kind to the first, and a layer of transparent adhesive uniting the two cells. In a manner characteristic of the invention, the first cell is essentially free of any substrate-forming layer, the active layers of the two cells facing each other and being united by said layer of transparent adhesive.

If so desired, the second cell may also be essentially free of any substrate-forming layer. In either case, the components may advantageously further comprise a reflecting support.

BRIEF DESCRIPTION OF THE DRAWINGS

Implementations of the invention are now described with reference to the accompanying drawings, in which the same numerical references always designate similar elements.

FIG. 1 shows the structure of a prior art multispectral cell in which the two elementary cells are connected together in series.

FIG. 2 shows the structure of a prior art multispectral cell in which the two elementary cells are provided with their own independent electrodes.

FIGS. 3a to 3d show successive steps in a first implementation of the method of the invention.

FIGS. 4a to 4d show successive steps in a second implementation of the method of the invention.

DETAILED DESCRIPTION OF THE INVENTION

FIGS. 1 and 2 show the conventional structure of a stacked type multispectral cell, in two variant embodiments.

The component is essentially built up from two elementary cells 1 and 2 having forbidden bands of different widths, which cells are generally selected from cells based on amorphous silicon, gallium arsenide, and indium phosphide.

These two cells are mechanically united by (optically inactive) transparent adhesive 3, said adhesive being either conductive (as shown in FIG. 1, in which case it serves not only to provide a mechanical connection but also an electrical connection), or else it is non-conductive (as shown in FIG. 2).

The first elementary cell 1 comprises a substrate 4 on which an active layer 5 is formed of a thickness and a structure that are selected as a function of the component to be made. This active layer 5 may be constituted by a stack of successive layers each of different composition, doping, and thickness, with the term "active layer" being used herein to designate such a stack as a whole. Metal deposits 6 and 7 provide electrical contact and constitute the electrodes of said first elementary cell.

The second elementary cell 2 is similar in structure (but with a different choice of material): a substrate 8 carries an active layer 9 and metal deposits 10 and 11 constitute the electrodes of the cell. The cell 2 may be a common commercial type of cell and it is used as such without any particular change to its structure. For example, it may be an amorphous silicon solar cell such as one of those described by A. Takeoka, *Technology Brightens Prospects for Solar Power*, Journal of Electrical Engineering, July 1991, p. 100.

When the adhesive 3 is conductive (FIG. 1) it electrically interconnects the electrodes 7 and 10, thereby connecting the two cells 1 and 2 in series; the electrodes 6 and 11 then constitute the terminals A and B of the component.

When the adhesive 3 is non-conductive (FIG. 2), each group of metal deposits is connected to a respective terminal $A_1$, $A_2$, $B_1$, or $B_2$ of the component for feeding distinct circuits in the electronic charging system. This configuration is more complex, but it makes it possible to take account of the different electrical parameters of the two cells, thereby, in particular, avoiding the drawback specific to connecting the two cells in series, whereby the photocurrent produced is necessarily limited to the smaller of the photocurrents generated by the two cells.

It may be observed that in their prior art structure, both cells always have their active faces facing upwards, i.e. the adhesive is applied to the back (substrate 4) of cell 1 which is adhered to the front (active layer 9) of cell 2.

The basic idea of the invention involves recovering the substrate of at least one of the two cells, e.g. by chemically or electrochemically dissolving a separation layer provided between the substrate and the active layer, with such dissolution being performed after the two cells have been adhered together.

FIGS. 3a to 3d are diagrams showing the successive steps of such a method.

Initially (FIG. 3a) two cells 1 and 2 are made separately in conventional manner, except that a thin soluble separation layer 12 is provided between the active layer 5 and the substrate 4 in the cell 1. For example, with a binary or ternary III–V semiconductor and substrate such as GaAs in particular, the soluble thin layer 12 may be an epitaxial layer of a ternary III–V semiconductor material that is rich in aluminum and that has an atomic lattice compatible with that of the substrate 4. In particular, this material of the layer 12 may be $Al_xGa_{1-x}As$ (on a GaAs substrate) or $Al_xIn_{1-x}As$ (on an InP substrate) with a molar fraction (concentration) of aluminum $x_{A1} \geq$ about 0.50. For example, the substrate 4 may be 500 μm thick and the thickness of the soluble thin layer may be of the order of a few tens of nanometers.

If the active layer 5 itself contains layers that are rich in aluminum, then its flanks must be protected by an inert material since otherwise the aluminum-rich layers would also be etched during dissolution. In this respect, reference may be made to French patent application 91-15139 in the name of the Applicant, which describes such a technique in detail. Essentially, a photosensitive resin or a component passivation layer (oxide or nitride) deposited in conventional manner is selected as the protective inert material, and said material is selectively removed so as to lay bare the separation layer 12 in an isolated region such as the region referenced 13 in FIG. 3a. This selective removal can be performed by conventional electron photolithographic techniques (when the layer is made of photosensitive resin) or by conventional etching techniques (when using a passivation layer).

Naturally, the material constituting the face of the active layer 5 that comes into contact with the separation layer 12 must have a low aluminum content since otherwise the component would be etched from below while the separation layer 12 is being dissolved. This material is generally a layer of GaAs, InP, or $Ga_xIn_{1-x}As$, with the aluminum-rich layers of $Al_xGa_{1-x}As$ being situated more deeply within the stack of layers constituting the active layer 5.

The two components are then adhered together (FIG. 3b) with adhesive that is conductive or insulating as required, in the same manner as in the prior art, but with the essential difference that in the invention the substrate of the cell 1 faces upwards, i.e. the cell 1 is adhered to the cell 2 via its active layer 5 and not via its substrate 4 (as is the case in the prior art configuration shown in FIGS. 1 and 2).

The assembly is then immersed in a bath of dilute acid, e.g. 50% hydrochloric acid; however, where the choice of acid is not limited in any way.

The effect of this operation (FIG. 3c) is to etch the aluminum-rich thin layer 12, with the acid beginning to react with the layer of $Al_xGa_{1-x}As$ in the bare location 13, and then proceeding edgewise through the layer.

In contrast, the remainder of the structure remains intact, and in particular the layers 3, 5, 8, and 9, and the detached substrate 4 whose flanks may optionally be protected by an inert layer.

This technique of separating the substrate by chemical dissolution is based on the fact that the compound $Al_xGa_{1-x}As$ having a high aluminum content ($x_{a1} \geq 0.50$) constituting the separation layer dissolves very quickly in hydrochloric or hydrofluoric acid, unlike GaAs or $Al_yGa_{1-y}As$ having a low aluminum content ($y_{A1} < 0.30$). In this respect, reference may be made to M. Konagai et el., *High Efficiency GaAs Thin Film Solar Cells by Peeled Film Technology*, Journal of Crystal Growth, No. 45 (1978), p. 277 or to E. Yablonovitch et el., *Extreme Selectivity in the Lift-Off of Epitaxial GaAs Films*, Appl. Phys. Lett., Vol. 51, No. 26, 28 December 1987, p. 222. As mentioned particularly in the latter article, very high selectivity in etching speed is observed as a function of the composition of the layer, said speed increasing very sharply once the molar fraction of aluminum exceeds the threshold of 40% to 50%.

Thus, for an epitaxial layer of $Al_xGa_{1-x}As$ that is several tens of nanometers thick, overnight immersion in HCl diluted to 50% causes said material to be completely etched away over the surface of a wafer having a diameter of 2 inches (about 5 cm), with the GaAs substrate falling away from the remainder of the component. The wafer of substrate detached in this way is not etched by the acid and is perfectly reusable for making other cells on the same wafer.

The process continues (FIG. 3d) by depositing metal electrodes on the free face of the cell 1; it may be observed that because there is no substrate, the metal electrodes make direct contact without any intervening substrate on the back face of the active layer 5, and as a result there is no need to form vies through the substrate.

In addition, the component may advantageously be mounted to a reflecting support 14, thereby doubling the absorption path of photons by reflecting them, and thus improving the overall efficiency of the component.

The technique described above achieves dissolution chemically.

Another technique in which dissolution is achieved electrochemically (anodic dissolution) may equally be employed, particularly for components that are not made on a GaAs or InP substrate, for which the above technique is not applicable.

This other technique is described in French patent application 91-15138 in the name of the Applicant and consists essentially in growing a $p^+$ doped thin separation layer 12 epitaxially on the substrate 4 which may be made of silicon, GaAs, InP, etc. Thereafter, the active layer 5 is formed on said separation layer 12. The separation layer 12 may also be obtained by implantation through the active layer 5.

Naturally, the material constituting the face of the active layer 5 that is in contact with the separation layer 12 is not p doped since otherwise the component would be etched from beneath during electrochemical dissolution of the separation layer 12. Said material is generally a layer that is $n^+$ doped. If the active layer includes one or more p layers, special precautions need to be taken to protect the flanks of the layer with an inert material, in the same manner as the aluminum-rich layers when dissolving chemically.

The anodic dissolution step consists in dissolving the semiconductor material of the $p^+$ doped separation layer 12 by placing it in contact with an electrolyte (e.g. KOH), said material constituting the anode relative to a reference electrode. By means of the "soluble anode" phenomenon, said electrode disappears progressively, i.e. the material of the separation layer, and of that layer only, is progressively removed. The electrolyte begins etching said layer at the location 13 that is bared, and thereafter it works edgewise through the layer. The remainder of the structure, in particular the substrate and the regions that may optionally be protected by means of an inert layer are electrochemically inert and they are thus left intact.

For further details on the phenomenon of a semiconductor material being dissolved electrochemically, reference may be made, in particular, to the study by T. Ambridge et al., *The Electrochemical Characterization of n-Type Gallium Arsenide*, Journal of Applied Electrochemistry, Vol. 3 (1973), p. 1, which describes a method in which said dissolution is used for determining the doping of an n-type layer of GaAs. Nevertheless that is merely a method seeking to characterize electrically a surface layer of a semiconductor structure, and it is not envisaged at any point that said technique could be used for separating a substrate from components formed thereon by dissolving a buried separation layer.

It will be observed that in this phenomenon of anodic dissolution, it is holes that participate in transferring charge, and not electrons (on this topic, see in particular H. Gerisher, *Physical Chemistry—An Advanced Treatise: IX A Electrochemistry*, Chapter 5, edited by Eyring, Henderson & Jost, Academic Press, New York (1970)). In other words, in the absence of holes, the semiconductor is not dissolved, which is equivalent to saying that only p-type semiconductors can be dissolved. n-type semiconductors can be dissolved only if holes are generated by some external action, typically by illumination. That is why provision is made for the process step of anodic dissolution in the invention to be performed in the dark, so as to dissolve only the p-type semiconductor while leaving the n-type semiconductors intact, in particular the material constituting the bottom region of the active layer.

The method described above with reference to FIGS. 3a to 3d is particularly applicable to a cell 2 on a substrate that is cheap, e.g. silicon, and in particular. amorphous silicon.

When both substrates are expensive or heavy, such as GaAs and InP, it is preferable to eliminate the substrates from both of the elementary cells.

In such a method, FIGS. 4a to 4d correspond to FIGS. 3a to 3d; in this case, in addition to providing a soluble thin layer 12 for the component 1, a soluble thin layer 15 is also provided for the component 2 between its substrate 8 and its active layer 9, with said layer being bared at 16.

The subsequent operations take place in the same manner as in the preceding process, and the electrochemical and chemical methods of dissolution may optionally be used in succession if so required by the natures of the respective materials of the two cells.

After the two elementary cells have been produced (FIG. 4a), adhered together active face against active face (FIG. 4b), and the substrates have been removed (FIG. 4c), a structure is obtained as shown in FIG. 4d that comprises only the two active layers 5 and 9 and the layer of adhesive 3. This structure is then fixed on a support 14 which, in this case, also acts as a mechanical support.

I claim:

1. A method of making a multispectral photovoltaic component comprising a stack of at least two elementary cells in association having different spectral response characteristics, the method being characterized by the following steps:

(a) producing a first cell (1) comprising a first substrate (4), a first optically active layer (5), and between said substrate and said active layer, a soluble thin layer (12);

(b) producing a second cell (2) comprising a second substrate (8) and a second optically active layer (9), different in nature from the first;

(c) placing said two cells face to face so that the active layers face each other;

(d) uniting the two elementary cells via their active layers by means of a transparent adhesive (3) in contact therewith; and (e) dissolving the material of the soluble layer while leaving the other materials intact, thereby separating the first substrate from the remainder of the structure, without dissolving the first substrate.

2. The method of claim 1, in which, in step (b) the second cell is produced with a soluble thin layer (15) between its substrate (8) and its active layer (9), so that in step (e) the second substrate is likewise separated from the remainder of the structure.

3. The method of claim 2, in which the material of the first substrate and/or of the second substrate is a binary or ternary III–V semiconductor, the corresponding soluble thin layer is an epitaxially grown layer or ternary III–V semiconductor material having a molar fraction of aluminum of not less than 40% and an atomic lattice that is compatible with that of the substrate on which it is grown epitaxially, and the dissolution in step (e) is performed chemically.

4. The method of claim 2, in which the material of the first substrate and/or of the second substrate is a semi-insulating or n-type semiconductor, the corresponding soluble thin layer is a layer of $p^+$ doped semiconductor material, the corresponding active layer includes at least an n doped bottom layer, and the dissolution in step (e) is performed anodically and without illumination.

5. The method of claim 2, further including a final step of:
(f) fixing the structure obtained in step (e) on a reflecting support (14).

6. The method of claim 1, in which the material of the first substrate and/or of the second substrate is a binary or ternary III–V semiconductor, the corresponding soluble thin layer is an epitaxially grown layer of ternary III–V semiconductor material having a molar fraction of aluminum of not less than 40% and an atomic lattice that is compatible with that of the substrate on which it is grown epitaxially, and the dissolution in step (e) is performed chemically.

7. The method of claim 1, in which the material of the first substrate and/or of the second substrate is a semi-insulating or n-type semiconductor, the corresponding soluble thin layer is a layer of $p^+$ doped semiconductor material, the corresponding active layer includes at least an n doped bottom layer, and the dissolution in step (e) is performed anodically and without illumination.

8. The method of claim 1, further including a final step of:
(f) fixing the structure obtained in step (e) on a reflecting support (14).

9. A multispectral photovoltaic component including a stack of at least two elementary cells in association and having different spectral response characteristics, comprising:

a first cell (1) comprising a first optically active layer (5);

a second cell (2) comprising a second optically active layer (9), different in nature to the first; and a layer of transparent adhesive (3) in contact with said first and second optically active layers for uniting said two cells;

the component being characterized in that:

the first cell is essentially free from any substrate-forming layer; and the active layers of the two cells face each other and are united by and through said layer of transparent adhesive.

10. The component of claim 9, in which the second cell is also essentially free from any substrate-forming layer.

11. The component of claim 10, further including a reflecting support (14).

12. The component of claim 9, further including a reflecting support (14).

* * * * *